US006199139B1

(12) United States Patent
Katayama et al.

(10) Patent No.: US 6,199,139 B1
(45) Date of Patent: Mar. 6, 2001

(54) REFRESH PERIOD CONTROL APPARATUS AND METHOD, AND COMPUTER

(75) Inventors: Yasunao Katayama, Hachiohji; Shigenori Shimizu, Machida, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/239,057

(22) Filed: Jan. 27, 1999

(30) Foreign Application Priority Data

Jan. 27, 1998 (JP) .................................................. 10-013586

(51) Int. Cl.[7] .......................... G11C 11/406; G11C 29/00
(52) U.S. Cl. .......................... 711/106; 714/754; 714/753; 714/764; 714/784; 365/222
(58) Field of Search ..................................... 711/106, 105; 714/6, 753, 754, 758, 761, 763, 764, 769, 773, 784, 799, 801; 365/222

(56) References Cited

U.S. PATENT DOCUMENTS

| 4,249,253 | | 2/1981 | Gentili et al. ......................... 714/765 |
| 4,319,356 | * | 3/1982 | Kocol et al. .......................... 714/754 |
| 4,380,812 | * | 4/1983 | Ziegler, II et al. ................... 714/754 |
| 4,617,660 | | 10/1986 | Sakamoto .................................. 714/6 |
| 4,694,454 | * | 9/1987 | Matsuura ................................. 714/6 |
| 4,758,992 | | 7/1988 | Taguchi ................................. 365/222 |
| 4,766,573 | * | 8/1988 | Takemae .............................. 365/222 |
| 4,935,900 | | 6/1990 | Ohsawa ................................. 365/222 |
| 5,157,634 | | 10/1992 | Dhong et al. ......................... 365/222 |
| 5,267,242 | * | 11/1993 | Lavallee et al. .......................... 714/7 |

(List continued on next page.)

FOREIGN PATENT DOCUMENTS

| 62-187192 | 7/1987 | (JP) . |
| 62-187580 | 7/1987 | (JP) . |
| 62-187958 | 7/1987 | (JP) . |
| 62-269608 | 10/1987 | (JP) . |
| 62-269674 | 10/1987 | (JP) . |
| 62-270364 | 10/1987 | (JP) . |
| 2-166769 | 6/1990 | (JP) . |
| 2-168926 | 6/1990 | (JP) . |
| 2-168927 | 6/1990 | (JP) . |
| 3-196328 | 8/1991 | (JP) . |
| 3-196373 | 8/1991 | (JP) . |
| 3-196650 | 8/1991 | (JP) . |
| 4-60988 | 2/1992 | (JP) . |

Primary Examiner—Eddie P. Chan
Assistant Examiner—Hong Kim
(74) Attorney, Agent, or Firm—Scully, Scott, Murphy & Presser; Wayne L. Ellenbogen, Esq.

(57) ABSTRACT

The present invention provides a memory system that optimizes, during a sleep mode, a refresh period for a memory device, such as DRAM, which stores meaningful data and for which a refresh operation is required to prevent the loss of data. More particularly, the present invention is directed to an apparatus for controlling, in a sleep mode, a refresh period for a memory device 13 that requires a refresh operation, comprises: an encoding circuit 3 for encoding data to obtain code that can be used to correct errors equal to or more than dual errors; a decoding circuit 5 for correcting errors and for decoding the corrected code; and a refresh period controller 7 for, following a transition to the sleep mode, changing a refresh period by using data, which is stored in the memory device 13 and encoded by the encoding circuit 3, until the refresh period becomes longest in a condition where there is no error that can not be corrected by the decoding circuit 5 and the number of correctable errors does not exceed a predetermined count, and where a refresh execution circuit 15 for performing the refresh operation for the memory device can deal with the changed refresh period, and for, following the first end of the change of the refresh period, setting the refresh execution circuit 15 so that the refresh of the memory device 13 is performed at the refresh period at the first end of the change of the refresh period.

27 Claims, 5 Drawing Sheets

U.S. PATENT DOCUMENTS

| | | | |
|---|---|---|---|
| 5,469,559 | 11/1995 | Parks et al. | 711/106 |
| 5,644,544 * | 7/1997 | Mizukami | 365/222 |
| 5,926,429 * | 7/1999 | Saitoh et al. | 365/222 |
| 6,065,145 * | 5/2000 | Bosshart | 714/754 |
| 6,076,183 * | 6/2000 | Espie et al. | 714/764 |

* cited by examiner

REFRESH PERIOD CONTROL APPARATUS AND METHOD, AND COMPUTER

BACKGROUND OF THE INVENTION

1. Technical Field

The present invention relates to a refresh operation for DRAM (Dynamic Random Access Memory), particularly to a method and apparatus for controlling the refresh period for DRAM during a sleep mode.

2. Prior Art

The DRAM, which is high-speed, high-density and low-bit-cost storage device, is used as a main memory in a computer, for example. To continuously hold data stored in cells of the DRAM, however, the refresh operation must be performed periodically. Because the performance of the refresh operation increases the power consumption necessary to hold data, techniques for reducing the power consumption have been developed.

For example, following techniques are disclosed: a technique for changing a refresh rate according to the temperature (See U.S. Pat. No. 5,278,796); a technique for shifting to a lower and fixed refresh rate in a suspend made (See U.S. Pat. No. 5,465,367); a technique in which cells having an inferior refresh characteristics are replaced with remaining memory cells and the refresh operation for a superior refresh characteristics is performed in a lower refresh rate (See U.S. Pat. No. 5,157,634); a technique for refreshing only memory cells which store effective data (See U.S. Pat. No. 5,469,559).

In addition, there exists a technique with respect to an error correction code used in a memory system. Mainly to prevent the occurrence of errors due to software errors, 1-bit error correctable, 2-bit error correctable, or 4-bit burst error detectable 72-bit code is used in a memory controller of a server, etc. These techniques have a high-speed error correction capability efficient for the software errors, however, in comparison with techniques in the communication or in the HDD (Hard Disk Drive) and etc, they only provide a relatively poor error correction capability. It also has been studied to mount an error correction encoding and decoding circuit on a DRAM chip (See U.S. Pat. Nos. 5,233,614 and 4,249,253, for instance). Furthermore, U.S. Pat. No. 4,617,660 discloses a technique for detecting hardware errors by an error correction circuit and for storing information stored in cells in which the hard ware errors occur in other memory after the correction.

One of references which disclose the correlation of the DRAM refresh with an error correction code technique is U.S. Pat. No. 4,758,992. in this US patent, a technique is disclosed in which because of a countermeasure for software errors, in a dynamic semiconductor storage device including an on-ship error detection/correction circuit, a refresh operation with an operation of the error detection/correction circuit and a refresh operation without the operation of the error detection/correction circuit are made selectable.

However because of a countermeasure for software errors, the error detection/correction circuit has only poor error correction capability, In addition, because it is mounted on the DRAM chip, this technique has defects that it is more expensive than a normal DRAM chip and it is impossible to alter or select the error correction capability in accordance with a request from a system designer, independently of the DRAM chip. Furthermore, this US patent does not specify the time to perform this technique and only discloses the synchronization of the refresh operation and the operation of the error detection/correction.

U.S. Pat. No. 4,935,900 discloses a technique for performing an error detection/correction operation during the refresh operation and for adjusting a clock for the refresh operation in response to the error detection. However, this US patent mentions only the synchronization of the refresh operation and the operation of the error detection/correction and does not specify the time to perform this technique. Because the refresh operation is always synchronized with the error detection/correction operation, even if the power consumption is reduced by extending the refresh period, the power consumption is increased by the error detection/correction operation. On the contrary, because the refresh operation is always synchronized with the error detection/correction, operation, it may assume high-speed but lower error correction capability. Furthermore, because it is mounted on the DRAM chip, this technique has defects that it is more expensive than a normal DRAM chip and it is impossible to alter or select the error correction capability in accordance with a request from a system designer, independently of the DRAM chip. In the whole of this US patent, it is also supposed that because under a consideration that errors will be accumulated so that an error recovery cannot be performed unless the error detection/correction operation is performed every refresh operation because errors occur in a condition in which the refresh period is maximized more frequently than in the normal state, driven by necessity, the error detection/correction operation is performed at each refresh operation. In other words, it is considered that both of extending the refresh period and not performing the error detection/correction operation every refresh operation are contradictory in view of reliability. Therefore, the increase of the power consumption caused by performing the refresh operation and the error detection/correction operation at the same timing becomes a problem. From this viewpoint, mounting the error detection/correction circuit on the DRAM chip is mandatory, however, the standard DRAM chip cannot be used.

Japanese Published Unexamined Patent Publication (PUPA) 04-60988 discloses a technique for measuring a environment condition, and by using the result, reducing the number of the refresh so as not to occur memory errors at the refresh. In addition, it discloses a technique for periodically setting the number of the refresh operation at an appropriate period. However, because it does not disclose any error correction, and discloses the time to start using DRAM is after any error does not occur, and discloses when the number of the refresh operation is periodically set at an appropriate period, data stored in the DRAM is copied to an external storage device, it is understood that the time to reduce the number of refresh operations first time in this publication is immediately after the computer is powered on. Therefore, if meaningful information is stored in the DRAM it is impossible to simply apply this technique disclosed in this publication. Furthermore, because when the number of the refresh operation is periodically set at an appropriate period, data stored in the DRAM is copied to an external storage device, extra power is consumed.

IBM Technical Disclosure Bulletin Vol. 34 No. 10B pp 217–218, March 1992 (hereinafter called TDB1) discloses a technique for performing a test at the power-on of a system, and setting a refresh period which is longest within a range that errors is correctable by the error correction code. However, because the test requires a test pattern stored in SPAM (Static Random Access Memory), extra hardware is needed. Furthermore, because the refresh period set based on the test at the power-on, the technique disclosed in the TDB1 cannot be performed if the meaningful information is stored in the DRAM.

Further, still IBM Technical Disclosure Bulletin Vol. 40 No. 6, pp 31–32, June 1997 (hereinafter called TDB2) discloses the following:

> to realize a high-density and low-cost battery-backup memory system, the adaptive DRAM refresh scheme with on-chip error correction/checking and compression circuits is adopted, and in a suspend mode, following operations are performed: (1) The on-chip logic circuitry performs error coding (both checking and correction) and compression of the stored data. This operation can be performed either once for the entire memory or many times after dividing the memory into multiple segments. (2) The timer triggers the refresh operation for a certain segment with only error checking. If no error was found, the next refresh for that segment will be performed with a prolong refresh cycle. (3) A SRAM is necessary. This is for performing the interval of the refresh cycle for different segments as well as for storing the temporary data during the error coding and compression operation.

The technique disclosed in TDB2 has following problems. That is, since, as well as some conventional technique, the error correction/checking circuit and the compression circuit are mounted on the DRAM chip, it is more expensive than a normal DRAM chip and it is also impossible to alter or select the error correction capability. In addition, because for each refresh, only error checking is performed at the same time, and only a case where there is no error causes the refresh cycle to be prolonged, for extending the refresh period efficiently, it is necessary to divide the DRAM into a plurality of segments and to change the refresh cycle for each segment. Furthermore, for reliably storing the refresh cycle for each segment, the SRAM is required, then the cost further increases.

By using the above described conventional technique, it is difficult to obtain a longer refresh period for DRAM which stores meaningful data, and whereby to provide highly reliable data storage and low power consumption. For example, those are not appropriate for following applications.

(1) in a server or a workstation, for storing memory contents by using a smaller battery capacity.
(2) in a PC, for storing memory contents in DRAM after the transition to the sleep state (In this application, the sleep state is widely defined as a state in which there is no read access or write access to a memory device from outside, which requires the refresh operation to continuously store data, such as DRAM.) By holding contents of DRAM with a smaller power even after the main power is turned off, it is enabled that the system quickly wakes up when the main power is turned on. As a result, an operation that the contents in the main memory is stored into a hard disk becomes unnecessary.
(3) in a network computer or a small personal information assistance, for replacing a non-volatile memory, such as a flash memory.
(4) in a small memory card for a digital camera etc., for replacing a non-volatile memory, such as a flash memory.

As described above, using the conventional technique it is difficult to adequately extend the refresh period for the DRAM in storing meaningful data.

It is, therefore, one object of the present invention to adequately extend the refresh period for the DRAM storing meaningful data.

It is another object of the present invention to adequately extend, during a sleep mode, the refresh period for a memory device, such as the DRAM, which stores meaningful data and for which a refresh operation is required to maintain data.

It is an additional object of the present invention to optimize, during a sleep mode, the refresh period for a memory device, such as the DRAM, which stores meaningful data and for which a refresh operation is required to maintain data.

It is a further object of the present invention to provide a memory system that optimizes, during a sleep mode, the refresh period for a memory device, such as the DRAM, which stores meaningful data and for which a refresh operation is required to maintain data, and that can cope with environmental changes in the vicinity of the memory device.

It is still another object of the present invention to provide a reliable memory system having a highly effective error correction function or a technique for replacing with a substitute area a portion of a memory where errors tend to occur.

It is a still further object of the present invention to provide a simple computer at a lower cost by using standard DRAM chips as to the extent as possible.

SUMMARY OF THE INVENTION

To achieve the above objects, according to the present invention, an apparatus for controlling, in a sleep mode, a refresh period for a memory device requiring a refresh operation, comprises: an encoding circuit for encoding data to obtain code that can be used to correct errors more than dual errors; a decoding circuit for correcting errors and decoding the corrected code; and a refresh period controller for, following a transition to the sleep mode, changing a refresh period by using data, which is stored in the memory device and encoded by the encoding circuit, until the refresh period becomes longest in a condition where there is no error that can not be corrected by the decoding circuit and the number of correctable errors does not exceed a predetermined count, and where a refresh execution circuit for performing the refresh operation to the memory device can deal with the changed refresh period, and for, following the first end of the change of the refresh period, setting the refresh execution circuit so as to perform the refresh operation to the memory device by the refresh period at the first end of the change of said refresh period. Since a longer refresh period can be set in accordance with the memory device, a reliable memory system can be constructed. The correction of more than dual errors is performed because it makes the predetermined count greater. The encoding process may include a compression process, and the encoding circuit may be operated after the system has been shift to the sleep mode. The change of the refresh period is limited to a range within which the refresh execution circuit can cope with the updated refresh period because the refresh period that can be set for the refresh execution circuit is unrelated to the optimal range for power consumption. In the embodiment, the change of the refresh period is performed at each refresh period; however, following the first end of the refresh period, the decoding circuit need not be operated in synchronization with the refresh operation.

After the termination of the sleep mode is externally instructed, the refresh period controller can set a normal refresh period for the refresh execution circuit; and before data stored in the memory device is employed, the refresh period controller may instruct the decoding circuit to operate for a required portion or all of the portions of the data. Although it depends on the type of encoding used, the decoding process may not be performed even after the sleep mode has been terminated.

After the decoding circuit has operated for a required portion or all of portions of the data, the refresh period controller circuit can inhibit the operations of the encoding circuit and the decoding circuit.

Following the first end of the change of the refresh period, the encoding circuit and the decoding circuit may be inhibited from operating in synchronization with the refresh circuit. The refresh execution circuit may be incorporated in the refresh period controller, or may be included in a circuit (e.g., DRAM) other than the refresh period controller.

Following the first end of the change of the refresh period, the refresh period controller may change the refresh period asynchronously with the refresh operation. As a result, the refresh period controller can cope with an environmental change after the first end of the change of the refresh period. The asynchronous change operation also includes a case where, after the first end of the change of the refresh period, the end of the operation for changing the refresh period is asynchronous with the end of the refresh operation to be performed. In addition, the asynchronous change of the refresh period may be a change in an asynchronous cycle, or may be performed in response to an external event (e.g., a change signal output in accordance with an environmental change).

The asynchronous cycle may be changed in accordance with the number of errors that are detected during the changing of the refresh period. As a result, an environmental change of a long cycle can be coped with, and power consumption can be reduced.

The change of the refresh period, which is performed asynchronously, may be performed until the refresh period becomes longest in a condition wherein there is no error that can not be corrected by the decoding circuit and the number of correctable errors does not exceed a predetermined count, and where the refresh execution circuit can deal with the changed refresh period. The change of the refresh period may also be performed by simply shortening or extending the refresh period by a unit period.

A circuit for copying, to another location, the correct content of an error line including a correctable error detected by the decoding circuit. As a result, a longer refresh period can be selected, and reliability can be increased.

The refresh period controller has been explained; however, it should be obvious to one having the ordinary skill in the art that the present invention can be implemented as a computer having such a refresh period controller, that the operation performed by the refresh period controller can be grasped as processing steps, and that the processing steps are implemented as a program.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENTS OF THE INVENTION

Figure 1:
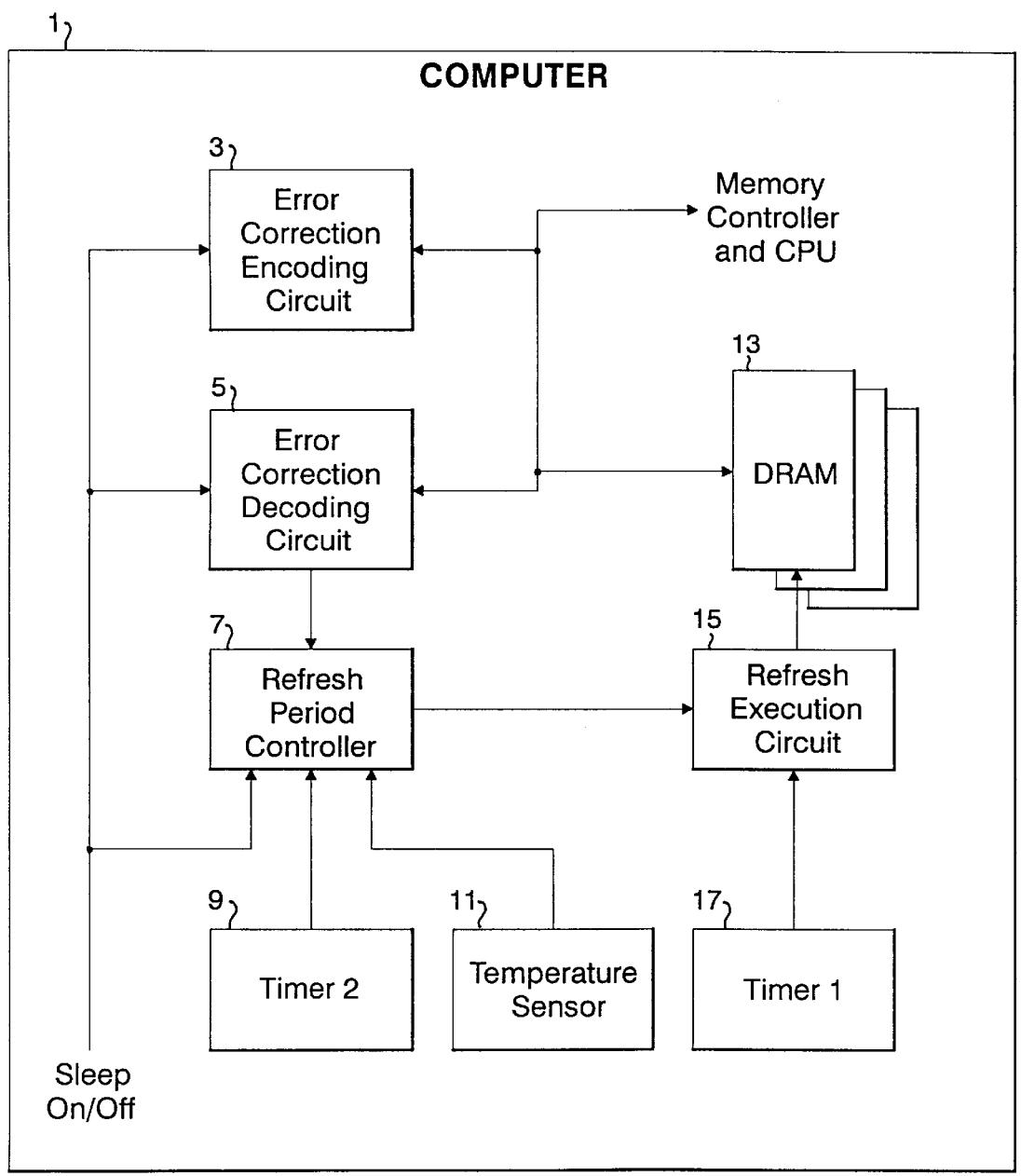
FIG. 1 is a functional block diagram illustrating Embodiment 1 of the present invention.

In one embodiment of the present invention, a DRAM chip either does not include a self-refresh function, or includes a self-refresh function but can not change a self-refresh period. FIG. 1 is a block diagram illustrating a computer 1 including a memory system according to the present invention. A plurality of DRAMs 13 are connected to a memory controller (not shown), a CPU (not shown), an error correction encoding circuit 3, an error correction decoding circuit 5, and a refresh execution circuit 15. The error correction encoding circuit 3 and the error correction decoding circuit 5 receive sleep ON and OFF signals. The refresh period controller 7 is connected to the error correction decoding circuit 5, a timer 2 (9), and a temperature sensor 11. The refresh period controller 7 also receives sleep ON and OFF signals. The refresh execution circuit 15 is connected to the refresh period controller 7 and a timer 1 (17). The timer 2 (9) and the temperature sensor 11 may not be provided.

Figure 2:
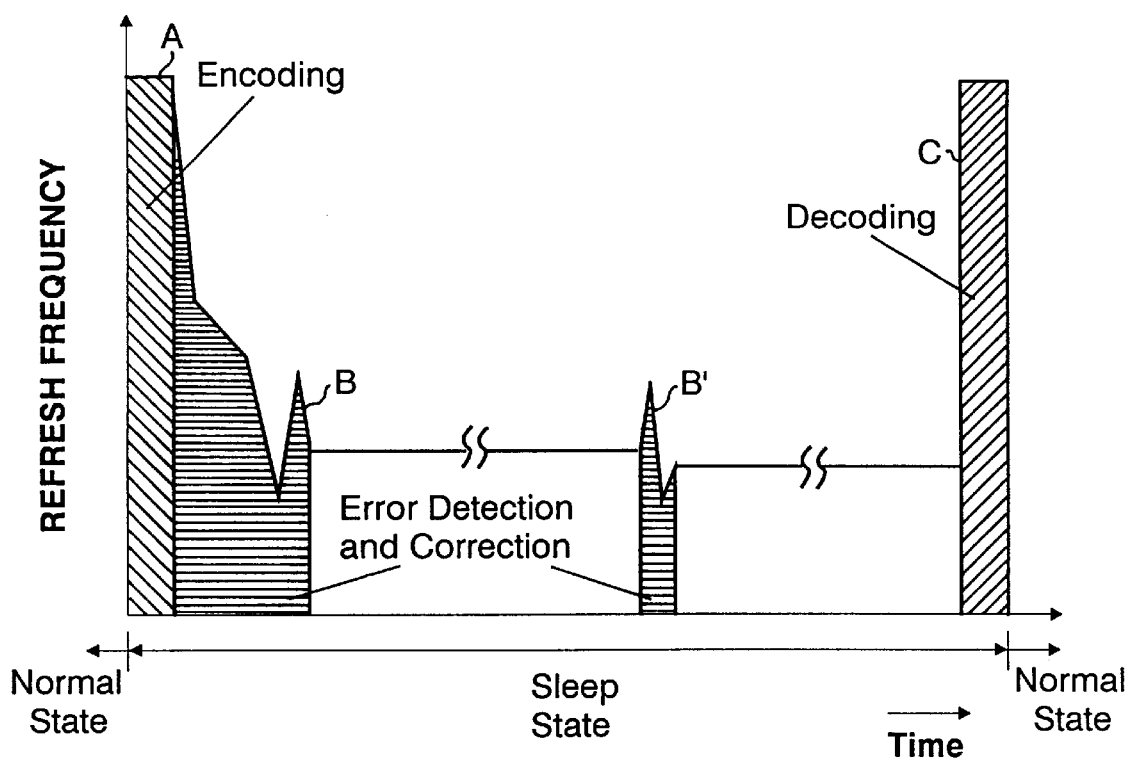
FIG. 2 is a timing chart for the present invention.

The operation performed by the memory system in FIG. 1 will now be described referring to FIG. 2. The vertical axis in FIG. 2 represents the refresh frequency, and the horizontal axis represents time. When the system is shift from the normal state to the sleep state, the memory controller or another entity transmits a sleep ON signal to the error correction encoding circuit 3. The error correction encoding circuit 3 performs encoding using, for example, Reed-Solomon (hereafter referred to as RS) code. Upon the receipt of the sleep ON signal, the error correction encoding circuit 3 encodes the contents of the DRAMs 13, and writes the generated codes to the DRAMs 13 (portion A in FIG. 2). The code type is not limited to RS code, but may be BCH code (Bose-Chaudhuri-Hocquenghem code). These codes can provide an efficient capability for the correction of errors more than dual errors. A circuit may be additionally provided for compressing the contents of the memories at the same time. Only the meaningful information in the DRAMs 13 may be encoded.

Following this, the refresh execution circuit 15 is so set that the refresh period controller 7 reduces the refresh frequency of the DRAMs 13 (extends the refresh period). The degree of reduction of the refresh frequency may be determined by using the output of the temperature sensor 11, which is connected to the refresh period controller 7, or may be determined in advance as a refresh period that is to be employed immediately after the system enters the sleep mode. In accordance with the refresh timing, the error correction decoding circuit 5 initiates the detection and correction of errors, and the corrected data is again written to the DRAMs 13. Since during this period the data are accessed frequently by the error correction decoding circuit 5, the refresh operation need not be performed, separately. The number of error lines detected by the error correction decoding circuit 5 is output to the refresh period controller 7.

The refresh period controller 7 determines whether there are no error lines that can not be corrected by the error correction decoding circuit 5, and whether the number of correctable error lines does not exceed a predetermined number. When these conditions are satisfied, the refresh frequency is further reduced. When the above process is repeated and the above described conditions are not satisfied, the refresh frequency is increased, and the refresh period is set to the refresh execution circuit 15, so that ideally, the above conditions are satisfied and the refresh frequency reaches the minimum (portion B in FIG. 2). The "predetermined number" here is determined by the error correction encoding capability. In this process, the contents of an error line may be copied to another line. In this embodiment, since the refresh execution circuit 15 and the timer 1 (17) are not incorporated in the DRAMs 13, an arbitrary value is supposed to be set for the timer 1 (17). When a limit is imposed on the value that can be set for the timer 1 (17), the refresh period is set so that it is within this limit.

When the lowest refresh frequency (the longest refresh period) that satisfies the above conditions is determined, the refresh period controller 7 sets the value for the refresh period in the timer 1 (17). When the timer 1 (17) has counted that value, the refresh execution circuit 15 begins the refresh operation (a CAS Before a RAS refresh in this embodiment) and repeats it. The error correction encoding circuit 3, the error correction decoding circuit 5 and the refresh period controller 7 do not operate, and only the timer 1 (17) and the refresh execution circuit 15 perform the refresh operation. Through the performance of this process, the power consumption is reduced.

The refresh operation may be repeated by the refresh execution circuit 15 and the timer 1 (17) until the system exits from the sleep mode. However, for a specific reason, an environmental change may occur, such as a rise in temperature, or a drop in temperature because of the sleep mode. If the temperature rises, the above conditions may not be satisfied unless the refresh frequency is increased. When the temperature drops, the length of the refresh period may be further extended. Therefore, the refresh period can be again adjusted at a period that is not related to the refresh period (e.g., the time counted by the timer 2 (9)), or in response to a temperature rise or drop higher or lower than a predetermined temperature, measured by the temperature sensor 11 (portion B' in FIG. 2). At this time, the refresh period may be extended or reduced to search for the optimal refresh period that satisfies the above described conditions. In the adjustment process, a predetermined period may be reduced from the refresh period in a simple case of the temperature rise, or a predetermined period may be extended from the refresh period in a simple case of the temperature rise. The refresh period controller 7 performs this process.

After the refresh period is adjusted, the refresh execution circuit 15 performs a refresh operation in accordance with a period newly set for the timer 1 (17). When a sleep OFF signal is received, the error correction decoding circuit 5 performs error correction and decoding (portion C in FIG. 2). After error correction and decoding is completed, the refresh frequency is returned to normal, and the normal process is thereafter performed.

Figure 3:
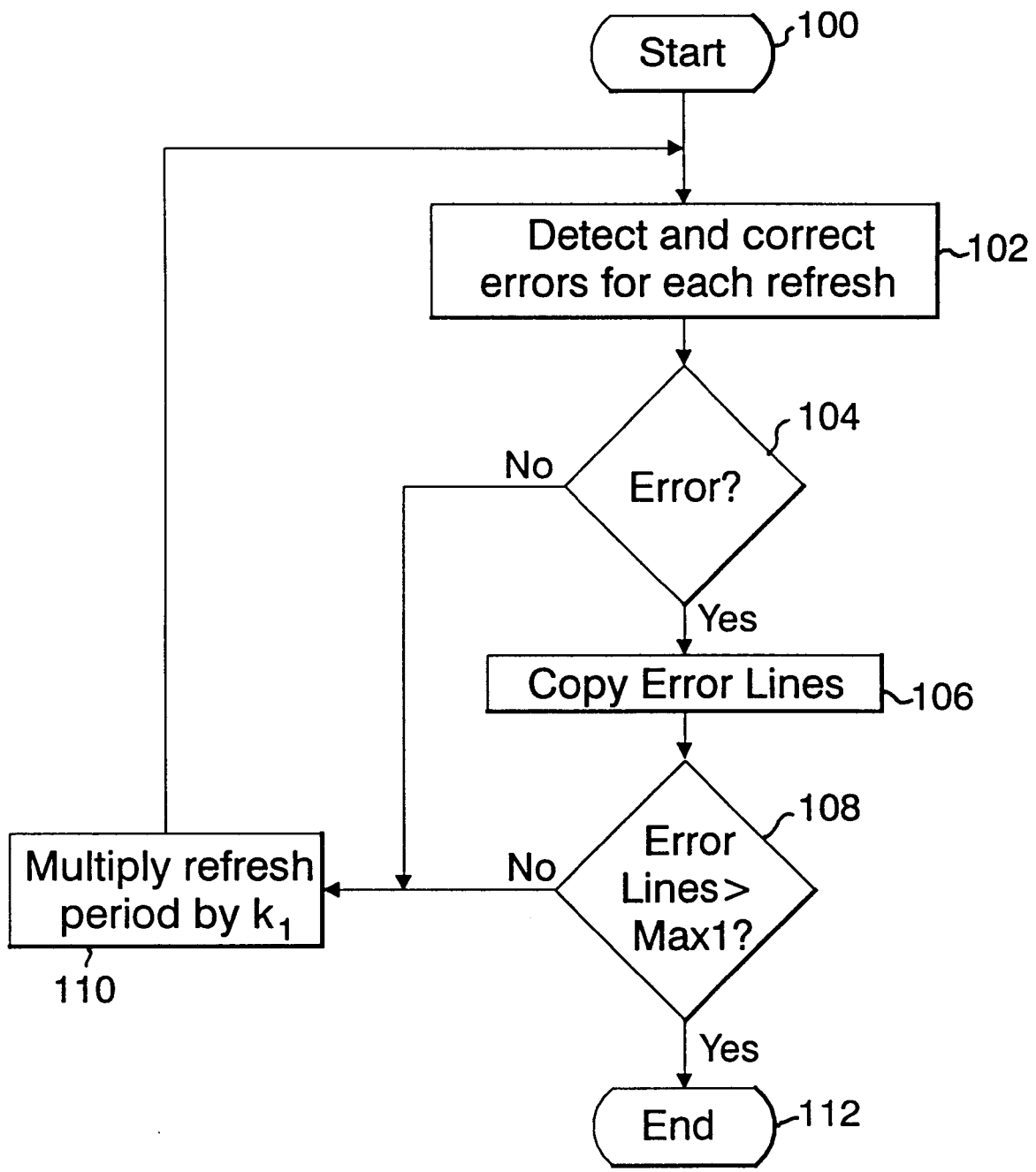
FIG. 3 is a flowchart for processing performed by a refresh period controller 7 for setting a timer 1 (17).

FIG. 3 is an example flowchart showing the processing performed by the refresh period controller 7 for setting the timer 1 (9) at portion B in FIG. 2. When the operation of the error correction encoding circuit 3 is completed, the refresh period controller 7 initiates its own operation (step 100), and causes the error correction decoding circuit 5 to perform error detection and correction at each refresh operation (step 102). When an error occurs (step 104), the refresh period controller 7 causes the error correction decoding circuit 5 to report this event, and to copy the error line to another location (step 106). A check is then performed to determine whether the number of error lines exceed a predetermined number Max1 (step 108). When no errors occur (step 104), or when the number of error lines does not exceed Max1, the refresh period is multiplied by $k_1$, and the refresh is performed in accordance with the new period (step 110). Since, in the situation where the refresh period is multiplied by $k_1$, the refresh period can be further extended, the control returns to step 102. When, at step 108, the number of error lines exceeds Max1, the change of the refresh period is terminated (step 112).

The processing in FIG. 3 is an example, and the error line may not be copied. If the error line is copied to another location, even when an error occurs that can not be corrected by the error correction encoding that is employed, the error can be corrected by recovering data from the substitute line, so that the refresh period can be extended. In this case, correlation of the line where an error has occurred with its substitute line is detected by using an address of the line where the error has occurred, or by acquiring a match using the error line data itself, so that further redundant bits that designate the substitute code can be eliminated.

The processing can be modified so that the step of temporarily reducing the refresh period is performed after step 108, $k_1$ is replaced by $k_2$, which is smaller than $k_1$, the control is returned to step 102, and when at step 108 the number of error lines exceeds Max1, the processing is terminated. The process for repetitively replacing $k_2$ with $k_3$ may also be performed. In this case, the time for reducing the refresh period should be shortened every change.

The processing in FIG. 3 may be performed at the time of portion B' (see FIG. 2).

The portion B' (FIG. 2) may be performed in response to an externally supplied signal (e.g., a signal from the temperature sensor 11) that indicates an environmental change, as described above, or may be performed at an asynchronous cycle with the Time 1 such as a cycle set for the Timer 2. When the time of the timer 2 is fixed, the processing in FIG. 3 can be preformed during the portion B'. Further, the value set for the timer 2 can be changed, adaptively. This is because even though the processing at portion B' is required from the viewpoint of the data storage dependability in the DRAMs 13, extra power is required and thus as few frequencies as possible are preferable.

Figure 4:
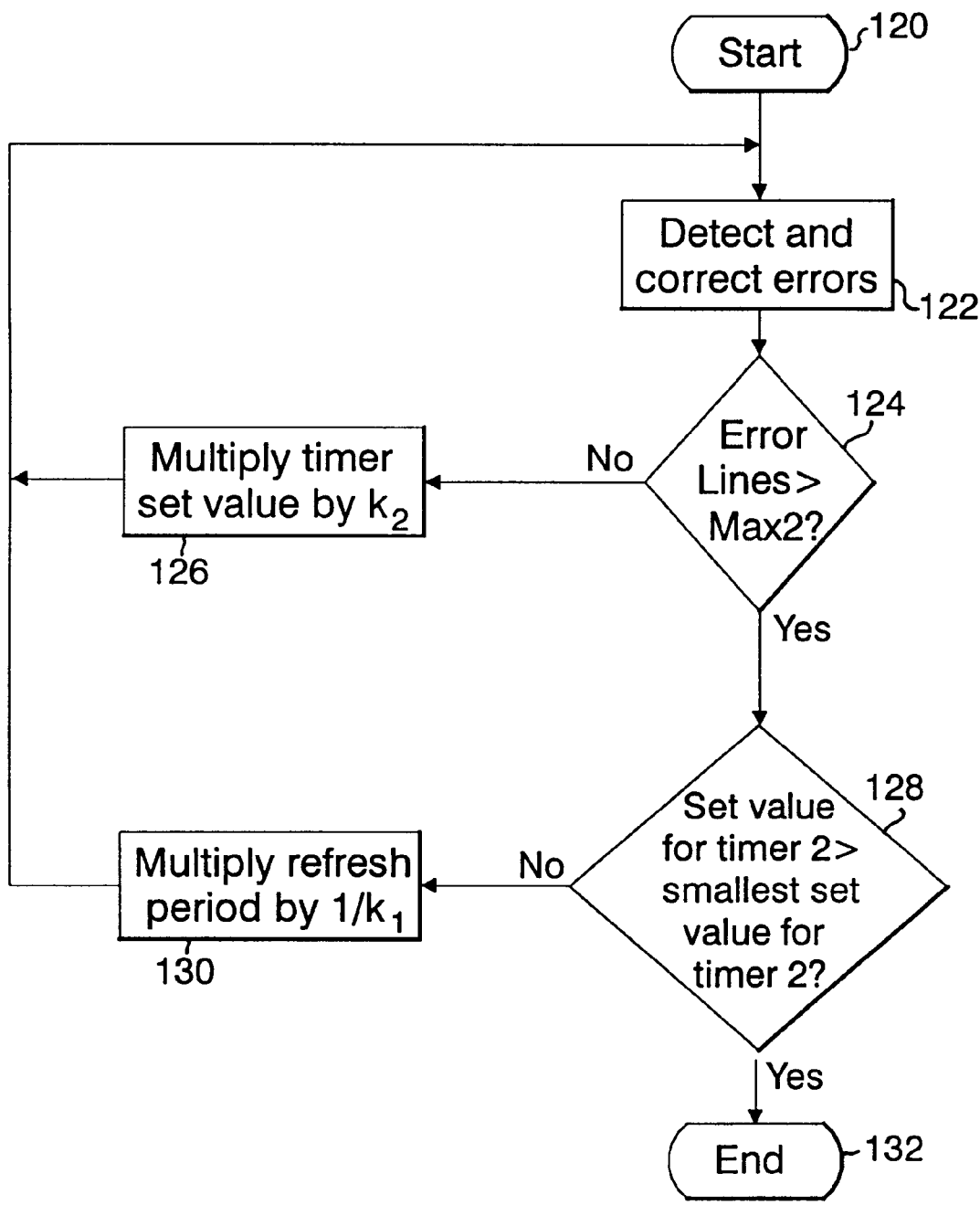
FIG. 4 is a flowchart for processing performed by the refresh period controller 7 for setting a timer 2 (9).

FIG. 4 shows an example method for adeptively setting an appropriate value for the timer 2 (9). The processing in FIG. 4 is initiated after the initial value for the timer 2 (9) has been counted. First, the refresh period controller 7 causes the error correction decoding circuit 3 to perform error detection and correction and to report the number of error lines (step 122). When the number of error lines is smaller than a predetermined Max2, the value set for the timer 2 (9) is multiplied by $k_2$ (step 126). When the Timer 2 (9) has counted the multiplied set value, the control returns to step 122. When the number of error lines exceeds Max2, a check is performed to determine whether the current value set for the timer 2 (9) is greater than the smallest value which can be set for the timer 2 (9) (step 128). When the value set for the timer 2 (9) is greater than the smallest set value, it is assumed that the value set for the timer 2 (9) is the optimal value, and the processing is thereafter terminated (step 132). When the current value set for the timer 2 (9) is smaller than the smallest set value, even though the number of error lines is greater than Max2, it is assumed that the refresh period is too long, and the refresh period is multiplied by $1/k_1$ (step 130).

Then, when the current value set for the timer 2 (9) has been counted, the control returns to step 122.

The performance of steps 128 and 130 are arbitrary. if these processes are to be performed, the setup of the timer 1 (17) must be adjusted. For example, the processing in FIG. 3 may be performed after the processing in FIG. 4 has been completed.

Figure 5:
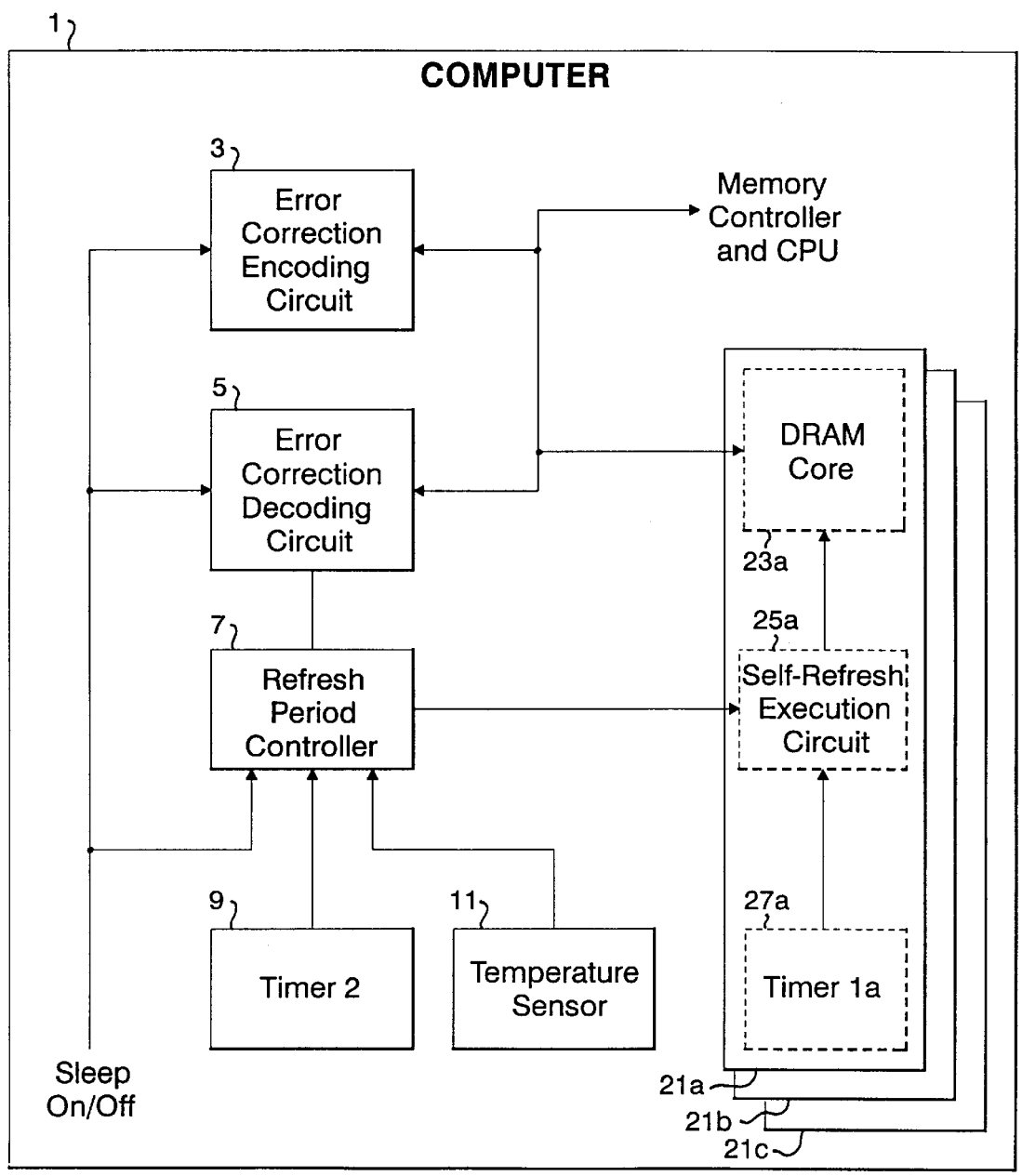
FIG. 5 is a functional block diagram illustrating Embodiment 2 of the present invention.

In a second embodiment of the present invention, a DRAM chip is employed that has a self-refresh function and that can alter a self-refresh period. The arrangement in Embodiment 2 is shown in FIG. 5, and the same reference numerals as used with respect thereto are also used to denote corresponding or identical components.

In this embodiment, a plurality of DRAM chips 21 are employed in a computer 1. The DRAM chips 21 each include a DRAM core 23, a self-refresh execution circuit 25 and a timer 1 (27). The DRAM core 23 is not related to the self-refresh function, and has the same function as the DRAMs 13 in the first embodiment (FIG. 1). A refresh period controller 7 performs the processing in FIG. 3 and sets a refresh period within a range that the timer 1 (27) can handle. To set the refresh period, for example, the refresh period controller 7 loads a predetermined value into a refresh period setup register in the DRAM chip 21.

Since the self-refresh execution circuit 25 is provided for each DRAM chip 21, the setup of the refresh period (e.g., the processing in FIG. 3) is performed for each DRAM chip 21. The refresh periods set for the individual DRAM chips 21 may differ.

Once the refresh periods are set, in response to a signal from a timer 2 (9) or a temperature sensor 11, the refresh periods are simultaneously reviewed asynchronously with the refresh periods in the DRAM chips 21. The review of the refresh periods may be performed individually for each DRAM chip 21; however, since the operating periods of the refresh period controller 7 and the error correction decoding circuit 7 are extended, power consumption will be increased. The setup process for the timer 2 (9) may be performed as in FIG. 4.

The preferred embodiments of the present invention have been described, but the present invention may be variously modified. In the above embodiments, a destination to which error lines are copied is a different location in the same memory. But when the computer 1 has a magnetic disk, an area in this device may be employed. In addition, when a battery sensor is provided for the computer 1 and the remaining battery capacity has decreased until it is equal to or lower than a predetermined value, data in the DRAM may be downloaded and stored on the magnetic disk in a server of a connected network, or in a local disk if it exists locally. If such a magnetic disk is not provided, an alarm message or sound may be output to alert a user. In addition, in the above embodiments, the error correction decoding circuit 5 initiates error correction and decoding immediately upon the receipt of the sleep OFF signal. The error correction and decoding may be performed immediately before the DRAM is employed. Further, instead of being performed in response to the sleep ON signal, the first error correction encoding process may have been performed before that.

One advantage of the present invention is that the refresh period for the DRAM, which stores meaningful data, can be adequately extended. In addition, the refresh period for the memory device, such as DRAM, which stores meaningful data and for which the refresh operation is required to continuously maintain data, can be adequately extended in the sleep mode.

Another advantage is that the refresh period for the memory device, such as DRAM, which stores meaningful data and for which the refresh operation is required to prevent the loss of data, can be optimized in the sleep mode. Also, the memory system can be provided that optimizes, in the sleep mode, the refresh period for the memory device, such as DRAM, which stores meaningful data and for which the refresh operation is required to maintain data, and that can cope with an environmental change surrounding the memory device.

Yet another advantage of the present invention is that since the frequencies of error corrections are reduced as the refresh period is extended, the increase in the power consumed for error correction can be sufficiently reduced, compared with the reduction in the power consumption due to the extension of the refresh period. Further, a reliable memory system can be provided by using a highly effective error correction function or a technique for replacing with a substitute area a portion of memory in which errors tend to occur. Additionally, a simple computer can be provided at a lower cost by using standard DRAM chips to the extent possible.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent:

1. An apparatus for controlling a refresh period of a memory device in a sleep mode in which there is no read and write access to said memory device, said memory device requiring a refresh operation for maintaining stored data, said apparatus comprising:
   an encoding circuit for encoding data to obtain code that can be used to correct errors equal to or more than dual errors;
   a decoding circuit for correcting errors and decoding the corrected code; and
   a refresh period controller for, following a transition to the sleep mode, changing a refresh period by using data, which is stored in said memory device and encoded by said encoding circuit, until the refresh period becomes longest in a condition where there is no error that can not be corrected by said decoding circuit and the number of correctable errors does not exceed a predetermined count, and where a refresh execution circuit for performing the refresh operation to the memory device can deal with the changed refresh period, and for, following the first end of the change of said refresh period, setting said refresh execution circuit so as to perform the refresh operation to said memory device by said refresh period at the first end of the change of said refresh period.

2. The apparatus according to claim 1, wherein, after the termination of said sleep mode is externally instructed, said refresh period controller sets a normal refresh period for said refresh execution circuit, and before data stored in said memory device is employed, said refresh period controller instructs said decoding circuit to operate for a required portion or all of the portions of said data.

3. The apparatus according to claim 2, wherein, after said decoding circuit has operated for the required portion or all of the portions of said data, said refresh period controller inhibits the operations of said encoding circuit and said decoding circuit.

4. The apparatus according to claim 1, wherein, following the first end of the change of said refresh period, said encoding circuit and said decoding circuit are inhibited from operating in synchronization with the refresh operation.

5. The apparatus according to claim 1, wherein said refresh execution circuit is incorporated in said refresh period controller.

6. The apparatus according to claim 1, wherein following the first end of the change of said refresh period, said refresh period controller changes said refresh period asynchronously with the refresh operation.

7. The apparatus according to claim 1, wherein, following the first end of the change of said refresh period, an operation for changing the refresh period is performed so that the end of said operation for changing said refresh period is asynchronous with the end of said refresh operation.

8. The apparatus according to claim 1, wherein following the first end of the change of the refresh period, said refresh period controller changes said refresh period in an asynchronous cycle with the refresh period which has been set at the first end of the change of said refresh period.

9. The apparatus according to claim 8, wherein the asynchronous period is changed in accordance with the number of errors that are detected during the changing of said refresh period.

10. The apparatus according to claim 1, further comprising:
a circuit for detecting a change of the environment surrounding said memory device and for outputtig a change signal,
wherein, following the first end of the change of said refresh period, said refresh period controller changes said refresh period in accordance with said change signal.

11. The apparatus according to claim 6, wherein the changing of said refresh period is performed until the refresh period becomes longest in a condition where there is no error that can not be corrected by said decoding circuit and the number of correctable errors does not exceed a predetermined count, and where said refresh execution circuit can deal with the changed refresh period.

12. The apparatus according to claim 8, wherein the changing of said refresh period is performed until the refresh period becomes longest in a condition where there is no error that can not be corrected by said decoding circuit and the number of correctable errors does not exceed a predetermined count, and where said refresh execution circuit can deal with the changed refresh period.

13. The apparatus of claim 10, wherein the changing of said refresh period is performed until the refresh period becomes longest in a condition where there is no error that can not be corrected by said decoding circuit and the number of correctable errors does not exceed a predetermined count, and where said refresh execution circuit can deal with the changed refresh period.

14. The apparatus according to claim 1, further comprising:
a circuit for copying, to another location, the correct content of an error line including a correctable error detected by said decoding circuit.

15. The apparatus according to claim 10, further comprising:
a circuit for detecting a change of the environment surrounding said memory device and for outputtig a change signal,
wherein, following the first end of the change of said refresh period, said refresh period controller changes said refresh period in accordance with said change signal.

16. The apparatus according to claim 1, wherein said refresh execution circuit is incorporated in said memory device.

17. A computer comprising:
a memory device requiring a refresh operation for maintaining stored data;
a refresh execution circuit for performing a refresh operation for said memory device;
an encoding circuit for encoding data to obtain code that is used to correct errors equal to or more than dual errors;
a decoding circuit for correcting errors and decoding the corrected code; and
a refresh period controller for, following a transition to the sleep mode in which there is no read and write access to said memory device, changing a refresh period by using data, which is stored in said memory device and encoded by said encoding circuit, until the refresh period becomes longest in a condition where there is no error that can not be corrected by said decoding circuit and the number of correctable errors does not exceed a predetermined count, and where said refresh execution circuit can deal with the changed refresh period, and for, following the first end of the change of said refresh period, setting said refresh execution circuit so as to perform the refresh operation to said memory device by the refresh period at the first end of the change of said refresh period.

18. A computer comprising:
a memory device requiring a refresh operation for maintaining stored data and including a refresh execution circuit for performing the refresh operation;
an encoding circuit for encoding data to obtain code that is used to correct errors equal to or more than dual errors;
a decoding circuit for correcting errors and decoding the corrected code; and
a refresh period controller for, following a transition to a sleep mode in which there is no read and write access to said memory device, changing a refresh period by using data, which is stored in said memory device and encoded by said encoding circuit, until the refresh period becomes longest in a condition where there is no error that can not be corrected by said decoding circuit and the number of correctable errors does not exceed a predetermined count, and where said refresh execution circuit can deal with the changed refresh period, and for, following the first end of the change of said refresh period, setting said refresh execution circuit so as to perform the refresh operation to said memory device by said refresh period at the first end of the change of the refresh period.

19. The computer according to claim 18, wherein following the first end of the change of the refresh period, said refresh period controller changes the refresh period asynchronously with the refresh operation.

20. The computer according to claim 19, wherein following the first end of the change of the refresh period, said refresh period controller changes the refresh period asynchronously with the refresh operation.

21. A method for controlling a refresh period for a memory device in a sleep mode in which there is no read and write access to said memory device, in a computer having said memory device requiring the refresh operation for maintaining stored data; an encoding circuit for encoding data to obtain code that is used to correct errors equal to or more than dual errors; and a decoding circuit for correcting errors and decoding the corrected code, said method comprising the steps of:
changing the refresh period by using data, which is stored in said memory device and encoded by said encoding circuit, until the refresh period becomes longest in a condition where there is no error that can not be corrected by said decoding circuit and the number of correctable errors does not exceed a predetermined count, and where a refresh execution circuit for performing the refresh operation to said memory device can deal with the changed refresh period; and after the first end of the change of said refresh period, setting said refresh execution circuit so as to perform the refresh operation to said memory device by said refresh period at the first end of the change of said refresh period.

22. The method according to claim 21, further comprising the steps of:

after the termination of said sleep mode is externally instructed, setting a normal refresh period for said refresh execution circuit; and before data stored in said memory device are employed, operating said decoding circuit for a required portion or all of the portions of said data.

23. The method according to claim 21, further comprising the step of:

following the first end of the change of said refresh period, changing the refresh period asynchronously with the refresh operation to be performed.

24. The method according to claim 21, further comprising the step of:

following the first end of the change of the refresh period, changing the refresh period in an asynchronous cycle with the refresh period which has been set at the first end of the change of the refresh period.

25. The method according to claim 24, wherein said asynchronous cycle is changed in accordance with the number of errors detected during the changing of said refresh period.

26. The method according to claim 21, wherein said computer further includes a circuit for detecting a change of an environment surrounding said memory device and for outputtig a change signal, said method further comprising:

changing said refresh period in accordance with said change signal.

27. The method according to claim 23, wherein the change of said refresh period is performed until the refresh period becomes longest in a condition where there is no error that can not be corrected by said decoding circuit and the number of correctable errors does not exceed a predetermined count, and where said refresh execution circuit can deal with the changed refresh period.

* * * * *